(12) United States Patent
Yu et al.

(10) Patent No.: US 9,613,796 B2
(45) Date of Patent: Apr. 4, 2017

(54) METHOD OF FLATTENING A WAFER

(71) Applicant: UNITED MICROELECTRONICS CORP., Hsin-Chu (TW)

(72) Inventors: Tai-Heng Yu, Tainan (TW); Chih-Yueh Li, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/818,293

(22) Filed: Aug. 4, 2015

(65) Prior Publication Data

US 2015/0340222 A1 Nov. 26, 2015

Related U.S. Application Data

(62) Division of application No. 12/164,109, filed on Jun. 30, 2008, now Pat. No. 9,136,105.

(51) Int. Cl.
*H01L 21/306* (2006.01)
*H01L 21/02* (2006.01)
*H01L 21/308* (2006.01)
*H01L 21/67* (2006.01)
*H01L 21/687* (2006.01)

(52) U.S. Cl.
CPC .. *H01L 21/02021* (2013.01); *H01L 21/02087* (2013.01); *H01L 21/3083* (2013.01); *H01L 21/30625* (2013.01); *H01L 21/6708* (2013.01); *H01L 21/68735* (2013.01)

(58) Field of Classification Search
None
See application file for complete search history.

(56) References Cited

U.S. PATENT DOCUMENTS

| 5,783,097 | A | 7/1998 | Lo |
| 6,117,778 | A | 9/2000 | Jones |
| 6,165,276 | A | 12/2000 | Lu |
| 7,018,926 | B2 | 3/2006 | Asakawa |
| 7,678,225 | B2 | 3/2010 | Nezu |
| 7,850,174 | B2 | 12/2010 | Endoh |
| 8,114,247 | B2 | 2/2012 | Endoh |
| 2004/0238488 | A1 | 12/2004 | Choi |
| 2005/0005859 | A1* | 1/2005 | Koshiishi .......... H01J 37/32642 118/728 |
| 2005/0178505 | A1 | 8/2005 | Kim |

(Continued)

FOREIGN PATENT DOCUMENTS

| JP | 7142449 | 6/1995 | |
| KR | 10-2008-0114041 | * 12/2008 | .......... H01L 21/304 |
| TW | I270116 | 1/2007 | |

*Primary Examiner* — Nadine Norton
*Assistant Examiner* — Mahmoud Dahimene
(74) *Attorney, Agent, or Firm* — Winston Hsu; Scott Margo

(57) ABSTRACT

The wafer bevel etching apparatus of the present invention includes a wafer-protecting mask to cover parts of a wafer. A central region and a wafer bevel region surrounding the central region are defined on the wafer. The wafer-protecting mask includes a center sheltering region and at least one wafer bevel sheltering region. The center sheltering region can completely shelter the central region of the wafer, and the wafer bevel sheltering region extends from the outside edge of the center sheltering region, shelters parts of the wafer bevel region, and exposes the other parts of the wafer bevel region.

14 Claims, 7 Drawing Sheets

(56) References Cited

U.S. PATENT DOCUMENTS

2006/0090848 A1    5/2006  Koga
2007/0068900 A1*  3/2007  Kim .................. H01J 37/32357
                                                      216/67
2007/0082134 A1*  4/2007  Fukuda .................. G03F 7/162
                                                      427/337

* cited by examiner

METHOD OF FLATTENING A WAFER

CROSS REFERENCE TO RELATED APPLICATIONS

This application is a divisional application of U.S. patent application Ser. No. 12/164,109 filed Jun. 30, 2008, which is herein incorporated by reference in its entirety.

BACKGROUND OF THE INVENTION

1. Field of the Invention

The present invention relates to a wafer bevel etching apparatus stand and the related method of flattening a wafer, and especially a method of flattening a wafer by utilizing a wafer bevel etching apparatus.

2. Description of the Prior Art

In processes of manufacturing semiconductor devices, material layers, such as a plurality of polysilicon layers, a plurality of metal interconnecting layers and a plurality of dielectric layers with low dielectric constants (low-k), are usually used to form these semiconductor devices or integrated circuits. However, the material layers deposited on the wafer usually have non-uniform thicknesses, or have surfaces of non-uniform horizontal height, so the surface of integrated circuit has a severe topography. As a result, it affects the subsequent processes, such as the chemical mechanical polishing (CMP) processes, the pattern transferring processes, or deposition processes of forming other material layers. As the sizes of semiconductor devices get into a level of deep microns, the CMP process is utilized to polish target thin films, such as materials on a semiconductor wafer, for planarity and uniformity, so all semiconductor chips can have a flat surface, and the yield of the subsequent processes can be ensured.

In regard to the traditional processes, the problem of non-uniform thicknesses is particularly obvious around the wafer bevel, and parts of the wafer are relatively thick on the wafer bevel. Although a CMP process can be performed for flattening after the deposition process, the thick film on the wafer bevel obstructs the CMP slurry, and affects the polishing stress distribution. In addition, the traditional CMP apparatus also has limitations, so this CMP process actually cannot effectively control the edge topography of the wafer, and the wafer still has a severe profile.

Please refer to FIG. 1, which is a schematic diagram showing the relationship between the thicknesses and the positions of a wafer formed by a traditional method, where the x-coordinate refers to the distance from the center of the wafer, and the y-coordinate refers to the thicknesses of the material layer on the wafer. The measured wafer undergoes a deposition process of an inter-layer dielectric (ILD) layer, a CMP process, and a wafer bevel rinse (WBR) process. As shown in FIG. 1, the film thickness of the wafer bevel and the film thickness of the center can have a difference of 800 angstroms (Å). The thicker wafer bevel not only affects the performance of the CMP process, but also includes more defects therein. These defects also affect the performance of following processes, and the subsequently formed devices or structures therefore have defects therein. Take the process of forming contact plugs as an instance. Although all the contact holes are etched in the same etching process, the contact holes near the wafer bevel cannot expose the underlying devices due to the thicker ILD layer on the wafer bevel. Thus, the formed contact plugs are not electrically connected to the underlying devices, and open defects occur. On the other hand, the bevel defects on the wafer bevel can also affect the following etching processes or other deposition processes. For example, it is observed that more unwanted nodules are formed in the following etching process while the material layer of the wafer bevel is thicker.

In light of this, many of the product wafers do not pass the wafer acceptance test (WAT), and the yield is therefore decreased. As a result, it is still a challenge to form a material layer having uniform thickness, and to control the edge topography.

SUMMARY OF THE INVENTION

It is therefore an objective of the present invention to provide a wafer bevel etching apparatus to increase the product yield and solve the problem of identifying a wafer mark.

From one aspect of the present invention, a wafer bevel etching apparatus is provided. The wafer bevel etching apparatus includes a wafer-protecting mask, and the wafer-protecting mask covers partial surfaces of a wafer. The wafer includes a central region and a wafer bevel region surrounding the central region. The wafer-protecting mask includes a center sheltering region and at least a wafer bevel sheltering region. The center sheltering region covers all the central region of the wafer. The wafer bevel sheltering region extends outwardly from the center sheltering region, covers parts of the wafer bevel region, and exposes the other parts of the wafer bevel region.

From another aspect of the present invention, a method of flattening a wafer is disclosed. First, at least a wafer is provided. The wafer includes a substrate and at least a dielectric layer disposed on the substrate. On the other hand, the wafer includes a central region and a wafer bevel region surrounding the central region. Subsequently, a wafer bevel etching process is performed. The wafer bevel etching process etches parts of the wafer bevel region, and do not etch the central region and other parts of the wafer bevel region. Furthermore, a CMP process is performed on the wafer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
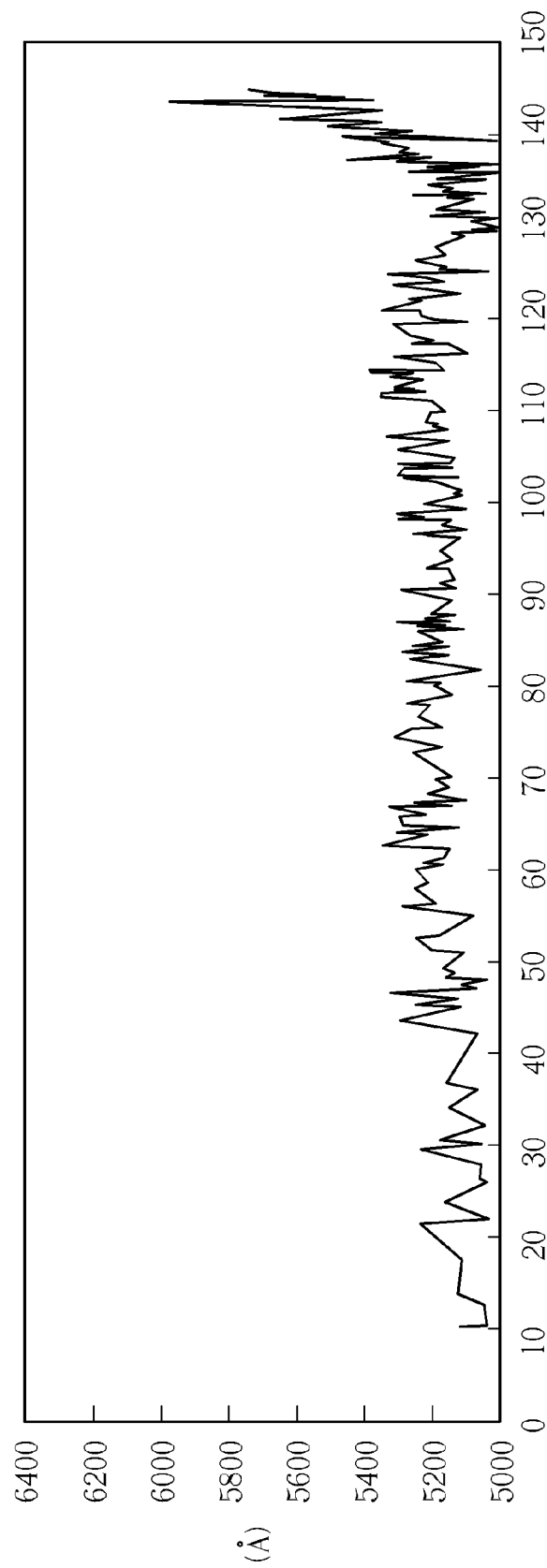
FIG. 1, which is a schematic diagram showing the relationship between the thicknesses and the positions of a wafer formed by a traditional method.
Figure 2:
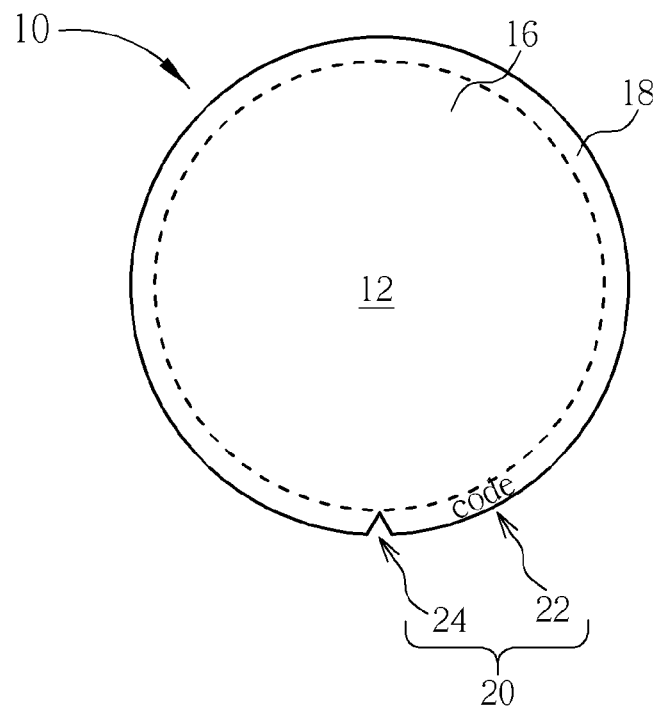
FIG. 2 through FIG. 8 are schematic diagrams illustrating a method of flattening a wafer in accordance with the first preferred embodiment of the present invention.

Please refer to FIG. 2 through FIG. 8, which are schematic diagrams illustrating a method of flattening a wafer 10 in accordance with the first preferred embodiment of the present invention, where like numbered numerals designate similar or the same parts, regions or elements. It is to be understood that the drawings are not drawn to scale and are served only for illustration purposes. FIG. 2 is a bottom view diagram of a wafer 10. As shown in FIG. 2, at least a wafer 10 is provided. A central region 16 and a wafer bevel region 18 surrounding the central region 16 are defined in the wafer 10. The wafer bevel region 18 has a width of several millimeters, and is located at the rim of the wafer 10. Taking 12-inch wafers as an example, the width of the wafer bevel region 18 can be in a range from 1 millimeter (mm) to 3 millimeters, and is usually about 2 millimeters. The wafer 10 can include a substrate 12. The substrate 12 can include at least a semiconductor element (not shown), such as parts of an integrated circuit, therein, and can include a plurality of wafer marks 20 in the wafer bevel region 18. For example, the wafer mark 20 can include a laser code 22, a notch 24, a fiducial mark (not shown), an alignment mark (not shown) or any component, which needs a protection. The laser codes 22 can be identified by an identification apparatus, where the laser locally melts the semiconductor in a pattern corresponding to the lot number and wafer number. A notch 24 can be applied for locating the orientation of the wafer 10 during various semiconductor processes.

Figure 3:
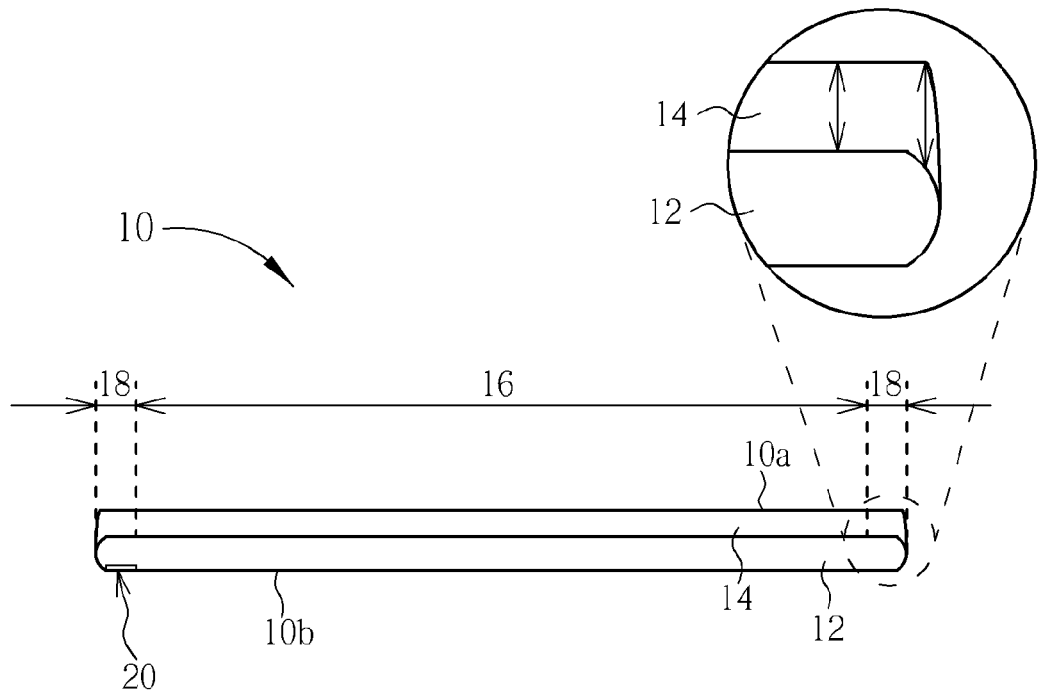

FIG. 3 is a schematic cross-sectional diagram of the wafer 10. As shown in FIG. 3, a process, such as a deposition process, a plating process or a spin-coating process, can be carried out on the wafer 10 to form at least a dielectric layer 14 on the substrate 12. According to the whole profile of the wafer 10, the wafer 10 has a top surface 10a and a bottom surface 10b. The semiconductor elements of the wafer 10 are usually disposed on the top surface 10a of the wafer 10 to define a plurality of dies. The wafer mark 20 can be disposed on the bottom surface 10b of the wafer 10, and can be exposed by the dielectric layer 14. In this embodiment, the dielectric layer 14 can be a target material layer to be polished. Parts of the dielectric layer 14 disposed in the wafer bevel region 18 are usually thicker than parts of the dielectric layer 14 disposed in the central region 16. In addition, the dielectric layer 14 can be an ILD layer directly covering the semiconductor element of the wafer 10. However, the wafer bevel etching method of the present invention should not be limited to the ILD layer, and can be applied to any material layer for wafer bevel etching. For example, the dielectric layer 14 can include an intermetal dielectric (IMD) layer.

Figure 4:
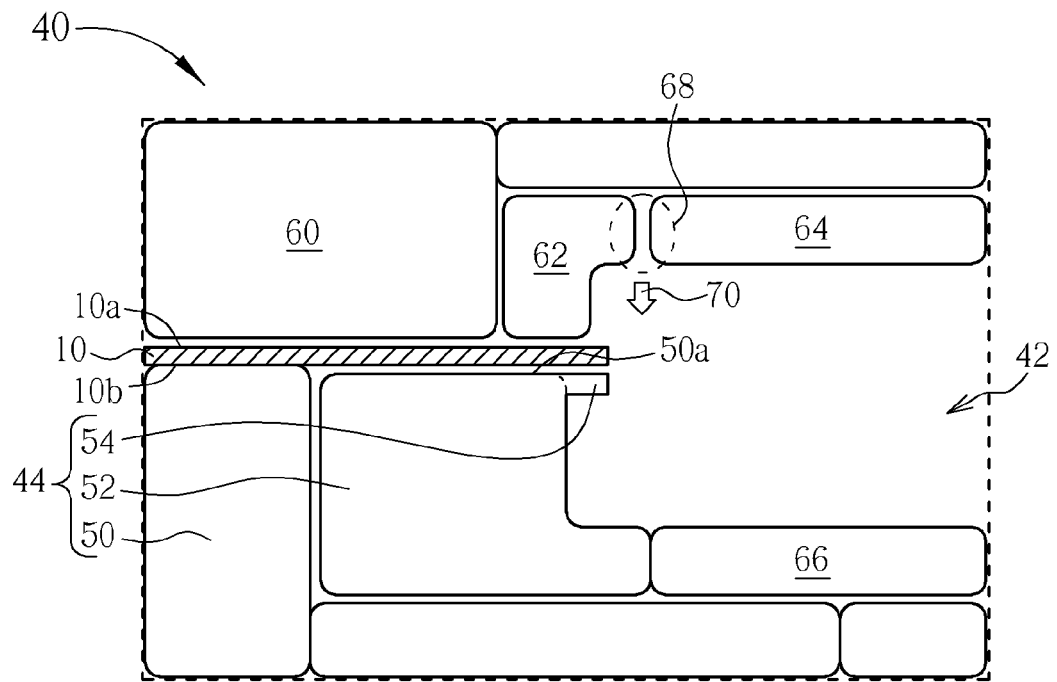
Figure 5:
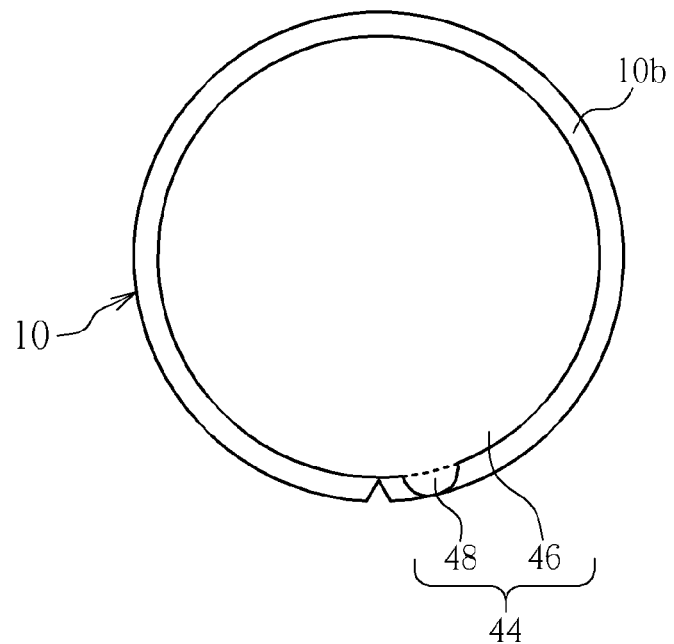
Figure 6:
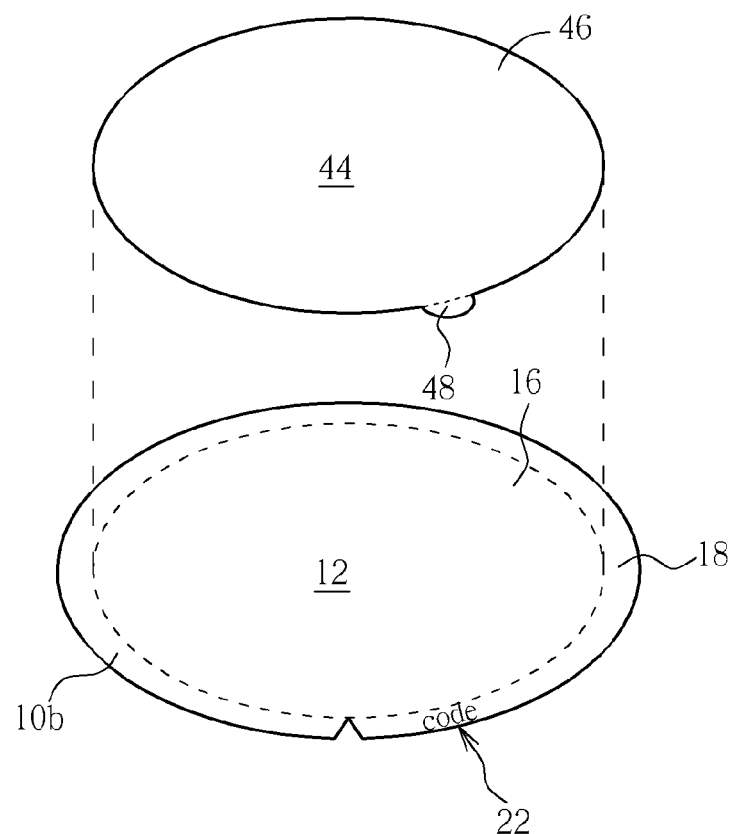

Please make reference to FIG. 4, FIG. 5 and FIG. 6 as a whole. FIG. 4 is a cross-sectional diagram of performing a wafer bevel etching process, FIG. 5 is a bottom view diagram of the wafer bevel etching process shown in FIG. 4, and FIG. 6 shows the sheltering condition in the wafer bevel etching process shown in FIG. 5. As shown in FIG. 4, the wafer 10 can be loaded into a wafer bevel etching apparatus 40 for undergoing a wafer bevel etching process. The wafer bevel etching apparatus 40 can include a first wafer-protecting mask 44 to cover parts of the bottom surface 10b of the wafer 10. The first wafer-protecting mask 44 can include a first block 50 and a first protecting ring 52 and at least a first protrusion 54 in an etching chamber 42. In this embodiment, the first block 50 can be a pedestal to support a wafer 10. For example, the first block 50 can be an electrostatic chuck (E-chuck), for attracting and fixing the wafer 10. The first protecting ring 52 can surround the first block 50. The top surface of the first protecting ring 52, which shelters the wafer 10, can be lower than or in the same level as the supporting surface 50a of the first block 50. Accordingly, there can be a little distance or no distance between the first protecting ring 52 and the wafer 10, so that the first protecting ring 52 can properly shelter parts of the bottom surface 10b of the wafer 10. The first protrusion 54 can extend outwardly from an outside edge of the first protecting ring 52 to a circumference of the wafer 10. The first protecting ring 52 and the first protrusion 54 can be integral, and can be named together as a bottom pedestal ring.

Please compare FIG. 4 with FIG. 5 and FIG. 6. The first block 50 and the first protecting ring 52 shown in FIG. 4 can form the center sheltering region 46 of the first wafer-protecting mask 44 shown in FIG. 5 and FIG. 6, while the first protrusion 54 shown in FIG. 4 can form the wafer bevel sheltering region 48 of the first wafer-protecting mask 44 shown in FIG. 5 and FIG. 6. As show in FIG. 5 and FIG. 6, the first wafer-protecting mask 44 can include a center sheltering region 46 and at least a wafer bevel sheltering region 48. The central region 16 of the wafer 10 can be completely sheltered from the bottom surface 10b by the center sheltering region 46. The wafer bevel sheltering region 48 can extend outwardly from the center sheltering region 46 to the circumference of the wafer 10, shelters parts of the wafer bevel region 18, and exposes the other parts of the wafer bevel region 18 that need etching. Therefore, the wafer bevel etching process does not etch the central region 16 and parts of the wafer bevel region 18 of the wafer 10, while the wafer bevel etching process etches parts of the dielectric layer (not shown) that are disposed in the other parts of the wafer bevel region 18. For instance, the wafer bevel sheltering region 48 of the first wafer-protecting mask 44 can cover the laser code 22 disposed in the wafer bevel region 18 of the wafer 10. The size, the shape and the position of the center sheltering region 46 can just correspond to that of the central region 16. Preferably, the related distance between the edge of the center sheltering region 46 and the edge of the central region 16 is less than or equal to 0.25 mm, and does not be limited to this range.

Furthermore, please refer to FIG. 4 again, the wafer bevel etching apparatus 40 can further include a second block 60, a second protecting ring 62, a first electrode 64, a second electrode 66 and an etching gas providing pipe 68 in the etching chamber 42. The second block 60 can be disposed above the first block 50, and is at a predetermined distance from the first block 50 to shelter parts of the top surface 10a of the wafer 10. The second protecting ring 62 can surround the second block 60. The bottom surface of the second protecting ring 62, which shelters the wafer 10, can be in the same level as the bottom surface of the second block 60. Accordingly, there can be a little distance or no distance between the second protecting ring 62 and the wafer 10, so that the second protecting ring 62 can properly shelter parts of the top surface 10a of the wafer 10. The first block 50, the first protecting ring 52, the first protrusion 54, the second block 60 or the second protecting ring 62 can include ceramic materials, and can contain a metal film, such as yttria (Y2O3), on its surface for protecting the wafer bevel etching apparatus 40 from etching. The first protecting ring 52 disposed around the first block 50 is removable, while the second protecting ring 62 disposed around the second block 60 is also removable. The etching gas providing pipe 68 can provide etching gas 70 for etching the dielectric layer 14, while the first electrode 64 and the second electrode 66 can provide a voltage difference to perform the wafer bevel etching process.

Figure 7:
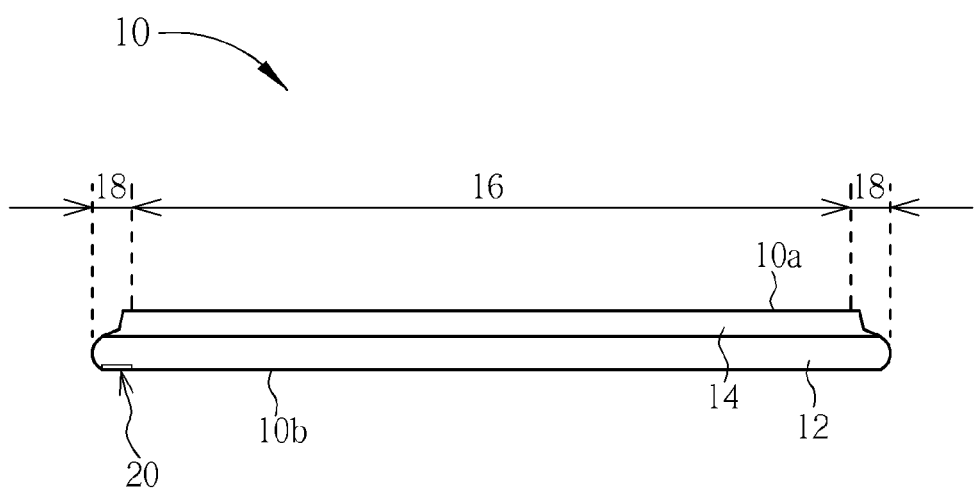

FIG. 7 is a cross-sectional diagram showing the wafer 10 after the wafer bevel etching process. As shown in FIG. 7, parts of the dielectric layer 14 disposed in the wafer bevel region 18 can be thinned, and bevel defects disposed in the wafer bevel region 18 can be reduced, while the particular region of the wafer can be protected in the meantime. For instance, the laser code 22 can be protected from etching, since the wafer bevel sheltering region 48 of the first wafer-protecting mask 44 can cover the laser code 22 of the wafer 10 during the etching process. Thus, the present invention can ensure the laser code 22 being identified after the etching process. It should be noticed that thicknesses of the dielectric layer 14 disposed in the wafer bevel region 18 can be thinner than, approximately the same as, or thicker than thicknesses of the dielectric layer 14 disposed in the central region 16 after the wafer bevel etching process. The thicknesses of the dielectric layer 14 disposed in the wafer bevel region 18 should not be limited to the drawings. In addition, the wafer bevel sheltering region 48 not only can shelter the wafer mark 20, but also can shelter any part of the wafer 10 that should not undergo the process reaction.

Figure 8:
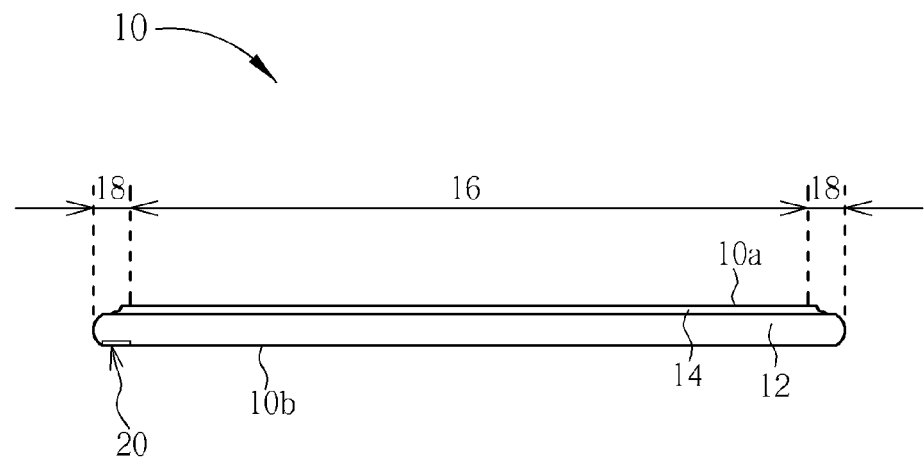

As shown in FIG. 8, a chemical mechanical polishing (CMP) process is next performed. A polishing slurry (not shown) is provided on the top surface 10a of the wafer 10, and the dielectric layer 14 is polished from the top surface 10a until the dielectric layer 14 is thinned to a predetermined thickness. A surface buffing process is thereafter performed by spraying deionized water (DI water) on the top surface 10a of the wafer 10 to remove the slurry as well as flakes on the dielectric layer 14.

Since the wafer bevel etching process of the present invention can effectively decrease the thicknesses of the dielectric layer 14 disposed in the wafer bevel region 18, the dielectric layer 14 no longer obstructs the CMP slurry, and the polishing stress distribution is no longer affected. As a result, the performance of the CMP process can be effectively increased. In addition, because the present invention can decrease the thicknesses of the dielectric layer 14 disposed in the wafer bevel region 18, a larger amount of polishing slurry can be added, and/or stronger downward stress can be applied. Therefore, a shorten time of CMP processing can be achieved. Accordingly, the present invention can increase the performance of the CMP process, controls the edge topography of the wafer bevel well, reduces bevel defects in the wafer bevel region 18, increases the product yield, and solves the problem of identifying a wafer mark.

Figure 9:
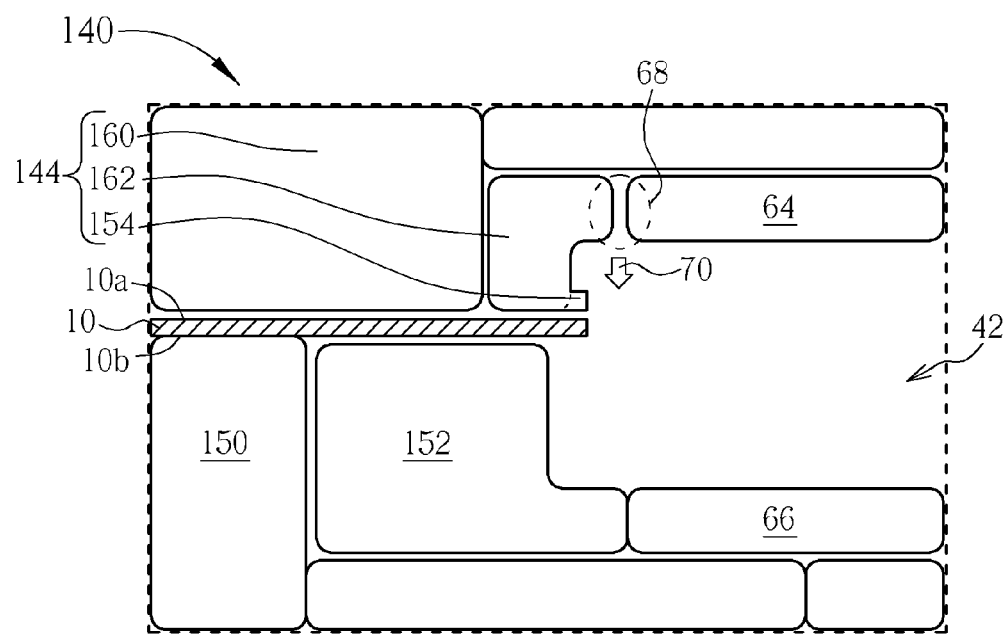
FIG. 9 and FIG. 10 are schematic diagrams illustrating a method of flattening a wafer in accordance with the second preferred embodiment of the present invention.
Figure 10:
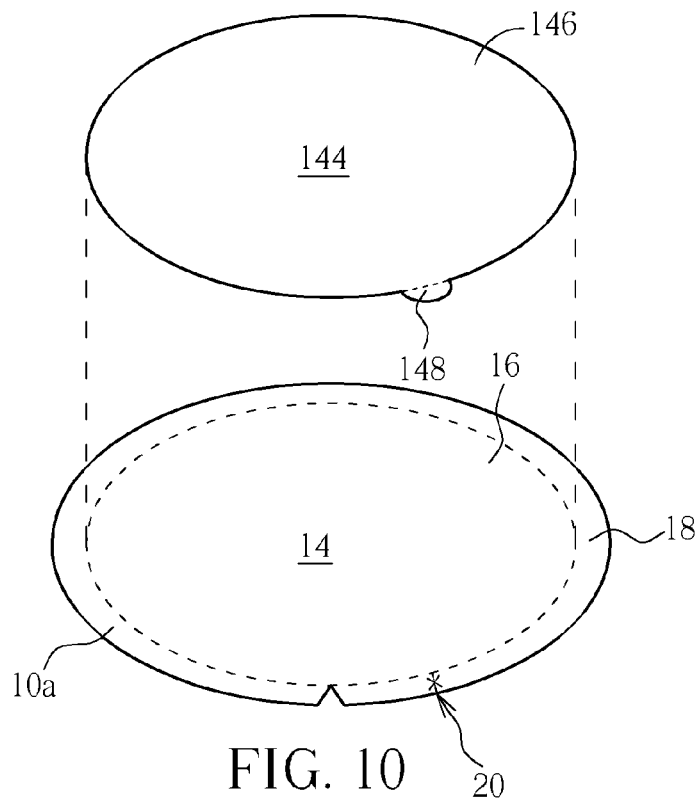

Although the first wafer-protecting mask 44 covers parts of the bottom surface 10b of the wafer 10 in the above-mentioned embodiment, the method and the apparatus should not be limited thereto. In other embodiments, the first wafer-protecting mask of the present invention can cover parts of the top surface of the wafer. Please refer to FIG. 9 and FIG. 10, which are schematic diagrams illustrating a method of flattening a wafer 10 in accordance with the second preferred embodiment of the present invention, where like numbered numerals designate similar or the same parts, regions or elements. FIG. 9 is a cross-sectional diagram of performing a wafer bevel etching process, and FIG. 10 shows the sheltering condition in the wafer bevel etching process shown in FIG. 9. As shown in FIG. 9 and FIG. 10, the wafer 10 can be loaded into a wafer bevel etching apparatus 140 for undergoing a wafer bevel etching process. The main difference between the first embodiment and the second embodiment is that the wafer bevel etching apparatus 140 includes a second wafer protecting mask 44 to shelter parts of the top surfaces 10a, while a wafer mark 20 of the wafer 10 is disposed on the top surface 10a in the wafer bevel region 18.

As shown in FIG. 9, the second wafer protecting mask 144 can include a second block 160, a second protecting ring 162 and at least a second protrusion 154 in an etching chamber 42. In this embodiment, the second block 160 is disposed above the wafer 10 to cover parts of the top surface 10a of the wafer 10. The second protecting ring 162 can surround the second block 160. The bottom surface of the second protecting ring 162, which shelters the wafer 10, can be in the same level as the bottom surface of the second block 160. Accordingly, there can be a little distance or no distance between the second protecting ring 162 and the wafer 10, so that the second protecting ring 162 can properly shelter parts of the top surface 10a of the wafer 10. The central region 16 of the wafer 10 can be completely sheltered from the top surface 10a by the second block 160 and the second protecting ring 162. The second protrusion 154 can extend outwardly from an outside edge of the second protecting ring 162 to a circumference of the wafer 10. The second protecting ring 162 and the second protrusion 154 can be integral, and can be named together as a top pedestal ring.

Furthermore, the wafer bevel etching apparatus 140 can further include a first block 150, a first protecting ring 152, a first electrode 64, a second electrode 66 and an etching gas providing pipe 68 in the etching chamber 42. The first block 150 can be disposed under the second block 160, and is at a predetermined distance from the second block 160. The first block 150, the first protecting ring 152, the second block 160, the second protecting ring 162 or the second protrusion 154 can include ceramic materials, and can contain a metal film on its surface. The first block 150 and the first protecting ring 152 can shelter parts of the bottom surface 10b of the wafer 10.

As shown in FIG. 10, the central region 16 of the wafer 10 can be completely sheltered from the top surface 10a by the center sheltering region 146. The wafer bevel sheltering region 148 can extend outwardly from the center sheltering region 146 to the circumference of the wafer 10, shelters parts of the wafer bevel region 18 from the top surface 10a, and exposes the other parts of the wafer bevel region 18 on the top surface 10a. For instance, the wafer bevel sheltering region 148 of the second wafer-protecting mask 144 can cover the shown wafer mark 20 disposed in the wafer bevel region 18 on the top surface 10a. The angle between the protected wafer mark 20 and the notch 24 can be 90 degrees, 180 degrees and/or 270 degrees. The second protrusion 154 can correspond to the wafer mark 20 that should be protected, and even covers the notch 24 of the wafer 10. Please compare FIG. 9 with FIG. 10. The second block 160 and the second protecting ring 162 shown in FIG. 9 can form the center sheltering region 146 of the second wafer-protecting mask 144 shown in FIG. 10, while the second protrusion 154 shown in FIG. 9 can form the wafer bevel sheltering region 148 of the second wafer-protecting mask 144 shown in FIG. 10.

Figure 11:
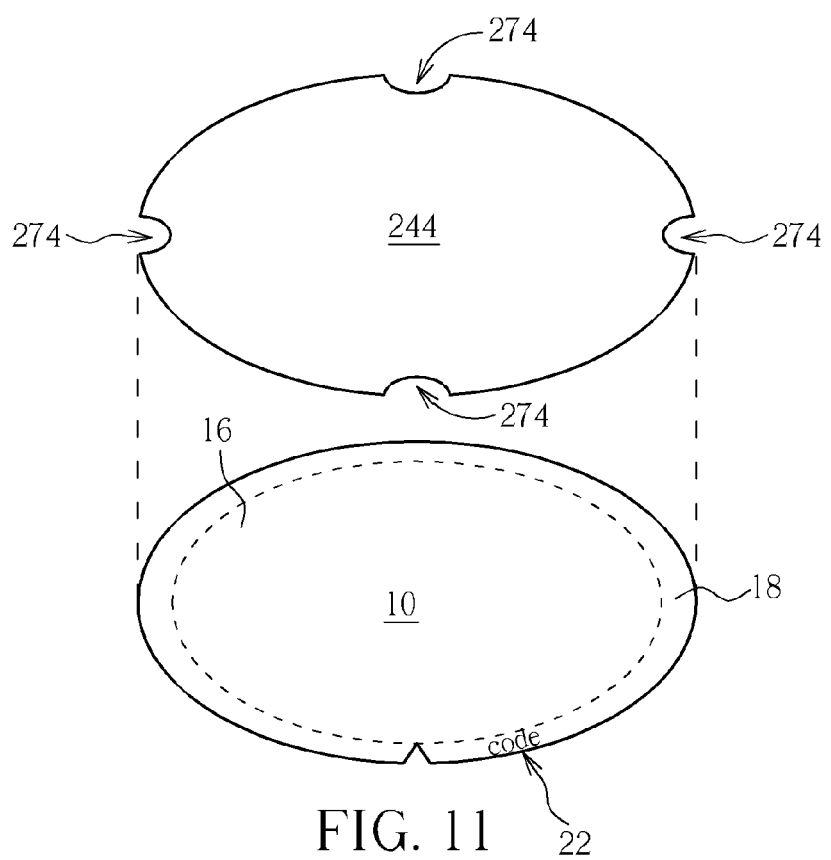
FIG. 11 shows the sheltering condition in the wafer bevel etching process in accordance with the third preferred embodiment of the present invention.

It should be noted that the wafer-protecting mask of the present invention can shelter the central region and parts of the wafer bevel region of the wafer, exposes the other parts of the wafer bevel region 18, and should not be limited to the above-mentioned first wafer-protecting mask 44 or second wafer-protecting mask 144. In other embodiments, shapes, positions, widths, lengths, level heights, thicknesses, constitution angles or quantities of the protecting ring and the protrusion can be adjusted according to process requirements. The protrusion can extend beyond the circumference of the wafer, or can extend outwardly without covering the circumference of the wafer. For example, a plurality of protrusions can be used to cover parts of the top surface and parts of bottom surface of the wafer in one wafer bevel etching process. In addition to the wafer-protecting mask, which includes a circular center sheltering region and a wafer bevel sheltering region extending outwardly, the wafer-protecting mask can be substantially a circular mask having a bevel-exposing opening. Please refer to FIG. 11, which shows the sheltering condition in the wafer bevel etching process in accordance with the third preferred embodiment of the present invention, where like numbered numerals designate similar or the same parts, regions or elements. As shown in FIG. 11, the wafer-protecting mask 244 of the third embodiment substantially corresponds to the whole wafer 10, and can shelter the wafer 10 from the top surface 10a or from the bottom surface 10b. The wafer-protecting mask 244 has at least a bevel-exposing opening 274. For example, the bevel-exposing opening (s) can be disposed at the notch 24 of the wafer 10, 90 degrees, 180 degrees and/or 270 degrees the wafer 10 from the notch 24. It is noted that the bevel-exposing opening 274 may not be in a concave shape shown in FIG. 11 as long as it moves inner than wafer edge. The inner extent depends on process requirements. An arc of the bevel-exposing opening 274 may be replaced by another arc having larger curvature radius.

Figure 12:
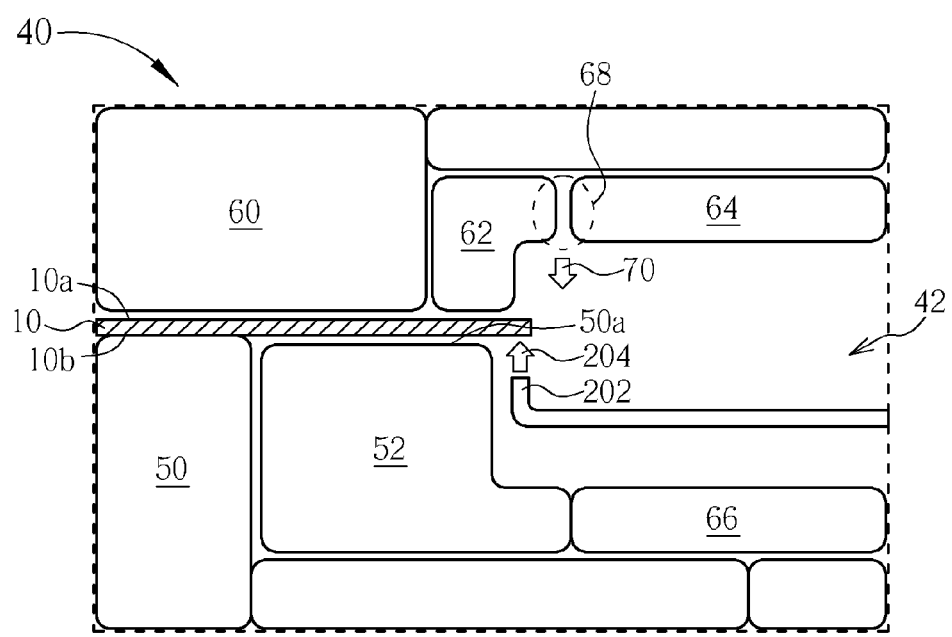
FIG. 12 is a schematic diagram illustrating a method of flattening a wafer in accordance with the fourth preferred embodiment of the present invention.

Moreover, a non-etching fluid, which does not etch the wafer 10, can be applied to protect the predetermined region of the wafer 10. Please refer to FIG. 12, which is a schematic diagram illustrating a method of flattening a wafer 10 in accordance with the fourth preferred embodiment of the present invention, where like numbered numerals designate similar or the same parts, regions or elements. As shown in FIG. 12, the main difference between the above-mentioned embodiments and this embodiment is that the wafer bevel etching apparatus 240 can further include at least a nozzle 202 disposed toward parts of the wafer bevel region 18 for providing at least a non-etching fluid 204, and for making the non-etching fluid 204 contact the parts of the wafer bevel region 18 of the wafer 10. The wafer bevel etching apparatus 240 can include a first block 50, a first protecting ring 52, a second block 60, a second protecting ring 62, a first electrode 64, a second electrodes 66 and an etching gas providing pipe 68 in a etching chamber 42. In this embodiment, the nozzle 202 is disposed toward the laser code 22 in the wafer bevel region 18 on the bottom surface 10b of the wafer. By controlling the position of the nozzle 202 and the flowing rates of the non-etching the fluid, the non-etching fluid 204 can cover the surface of the laser code 22 so to prevent the laser code 22 from contacting the etching gas 70. Thus, parts of the dielectric layer 14 disposed in the wafer bevel region 18 can be thinned, and bevel defects disposed in the wafer bevel region 18 can be reduced, while the particular region of the wafer can be protected in the meantime. It should be noticed that the nozzle 202 of third embodiment could be combined with the wafer bevel etching apparatus 40 or the wafer bevel etching apparatus stand 140 as assistance in the wafer bevel etching process.

In sum, the present invention has the following advantages. First, the wafer bevel etching process of the present invention can effectively decrease the thickness of the dielectric layer in the wafer bevel region. Therefore, the present invention not only can reduce bevel defects in the wafer bevel region 18, but also can prevent the performance of the following processes from being affected by the thick material layer in the wafer bevel region. In addition, the present invention can also protect the particular region of the wafer during the etching process so as to protect the wafer marks, such as the laser code, from being indistinct. In light of this, the present invention can effectively control the edge topography of the wafer bevel, increases the product yield, and solves the problem of identifying a wafer mark.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of flattening a wafer, comprising:
providing at least a wafer, the wafer comprising a substrate and at least a dielectric layer disposed on the substrate, the wafer comprising a central region and a wafer bevel region surrounding the central region;
providing a wafer-protecting mask, wherein the wafer-protecting mask comprises a center sheltering region, covering all the central region of the wafer, and at least a wafer bevel sheltering region, extending outwardly from the center sheltering region, covering parts of the wafer bevel region, and exposing the other parts of the wafer bevel region when viewed in bottom view, wherein the shape of the wafer bevel sheltering region is a semicircular tab and the wafer bevel sheltering region being configured along the edge of the center sheltering region;
performing a wafer bevel etching process, the wafer bevel etching process uses the wafer-protecting mask to cover the central region and parts of the wafer bevel region, to etch parts of the wafer bevel region, and not etching the central region and other parts of the wafer bevel region; and
performing a chemical mechanical polishing (CMP) process on the wafer.

2. The method of claim 1, wherein the wafer bevel sheltering region of the wafer-protecting mask extends outwardly from an outside edge of the center sheltering region to a circumference of the wafer.

3. The method of claim 1, wherein the wafer has at least a wafer mark disposed in the wafer bevel region on a bottom surface of the wafer.

4. The method of claim 3, wherein the wafer bevel sheltering region of the wafer-protecting mask covers the wafer mark of the wafer.

5. The method of claim 4, wherein the wafer mark comprises a laser code.

6. The method of claim 1, wherein the wafer comprises at least a semiconductor element and at least a wafer mark, the semiconductor element is disposed on the central region near a top surface of the wafer, and the wafer mark is disposed on the wafer bevel region on the top surface of the wafer.

7. The method of claim 6, wherein the wafer bevel sheltering region of the wafer-protecting mask covers the wafer mark of the wafer.

8. The method of claim 1, wherein the wafer-protecting mask comprises a block, a protecting ring and at least a protrusion, the protecting ring surrounds the block, and the protrusion extend outwardly from an outside edge of the protecting ring.

9. The method of claim 8, wherein the block and the protecting ring form the center sheltering region of the wafer-protecting mask, and the protrusion forms the wafer bevel sheltering region of the wafer-protecting mask.

10. The method of claim 9, wherein the block comprises a pedestal for supporting the wafer.

11. The method of claim 1, wherein the wafer bevel sheltering region physically contacts the center sheltering region.

12. The method of claim 11, wherein the wafer bevel sheltering region and the center sheltering region are a monolithically formed structure.

13. The method of claim 1, wherein a width of the wafer bevel region is in a range from 1 millimeter to 3 millimeters.

14. The method of claim 1, wherein the wafer bevel etching process does not etch the wafer mark of the wafer.

* * * * *